United States Patent
Ishizuka (10) Patent No.: US 9,698,747 B2
(45) Date of Patent: Jul. 4, 2017

(54) IMPEDANCE CONVERSION CIRCUIT AND ANTENNA DEVICE

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/659,758

(22) Filed: Mar. 17, 2015

(65) Prior Publication Data

US 2015/0188511 A1    Jul. 2, 2015

Related U.S. Application Data (63) Continuation of application No. PCT/JP2013/067801, filed on Jun. 28, 2013.

(30) Foreign Application Priority Data

Sep. 28, 2012  (JP) .................................. 2012-217710

(51) Int. Cl.
  *H01Q 1/50*  (2006.01)
  *H03H 7/38*  (2006.01)
  *H03H 1/00*  (2006.01)

(52) U.S. Cl.
  CPC ............... *H03H 7/38* (2013.01); *H01Q 1/50* (2013.01); *H03H 2001/0085* (2013.01)

(58) Field of Classification Search
  CPC ...... H01Q 1/243; H01Q 1/38; H01F 17/0013; H01F 17/0006
  USPC .................. 343/860, 745; 336/200
  See application file for complete search history.

(56) References Cited

U.S. PATENT DOCUMENTS

| | | | |
|---|---|---|---|
| 2010/0033178 A1* | 2/2010 | Lee ................. | G01R 33/3642 324/307 |
| 2011/0309994 A1* | 12/2011 | Kato ................. | H01P 1/20345 343/860 |
| 2012/0139814 A1* | 6/2012 | Ishizuka ............ | H01P 1/20 343/860 |

FOREIGN PATENT DOCUMENTS

| | | |
|---|---|---|
| JP | 49-035934 B1 | 4/1974 |
| JP | 52-154133 U | 11/1977 |
| JP | 2004-260377 A | 9/2004 |

(Continued)

OTHER PUBLICATIONS

Official Communication issued in International Patent Application No. PCT/JP2013/067801, mailed on Oct. 1, 2013.

(Continued)

*Primary Examiner* — Dameon E Levi
*Assistant Examiner* — Collin Dawkins
(74) *Attorney, Agent, or Firm* — Keating & Bennett, LLP (57) ABSTRACT

In an impedance conversion circuit, a first coil element and a third coil element are arranged coaxially adjacent to each other, and a second coil element and a fourth coil element are arranged coaxially adjacent to each other. By arranging the first and third coil elements in close proximity and arranging the second coil element and the fourth coil element in close proximity in a layering direction, the first coil element is mainly magnetically coupled with the third coil element, and the second coil element is mainly magnetically coupling with the fourth coil element. The first coil element is connected in parallel to the second coil element, and the third coil element is connected in series to the fourth coil element.

19 Claims, 7 Drawing Sheets

(56) References Cited

FOREIGN PATENT DOCUMENTS

| | | |
|---|---|---|
| JP | 2012-085305 A | 4/2012 |
| JP | 4935956 B2 | 5/2012 |

OTHER PUBLICATIONS

Official Communication issued in corresponding Japanese Patent Application No. 2014-508407, mailed on May 20, 2014.

* cited by examiner

IMPEDANCE CONVERSION CIRCUIT AND ANTENNA DEVICE

BACKGROUND OF THE INVENTION

1. Field of the Invention

The present invention relates to impedance conversion circuits and antenna devices including impedance conversion circuits.

2. Description of the Related Art

In recent years, it is desired that communication terminal devices such as cellular phones are compatible with a wide variety of communication systems. In such communication terminal devices, antenna devices need to cover a wide range of frequency bands, such as, for example, from 800 MHz to 2.4 GHz.

Figure 6:
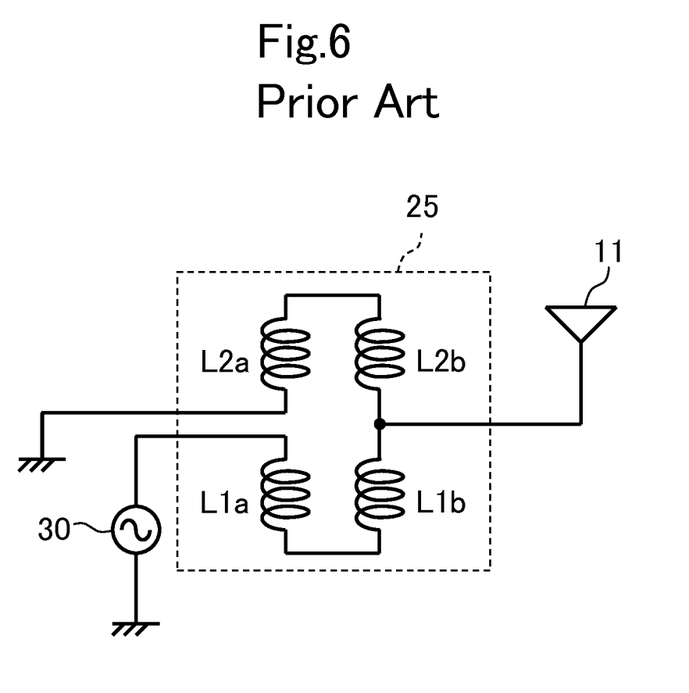
FIG. 6 is one example of a circuit diagram of an antenna device illustrated in Japanese Patent No. 4935956.
Figure 7:
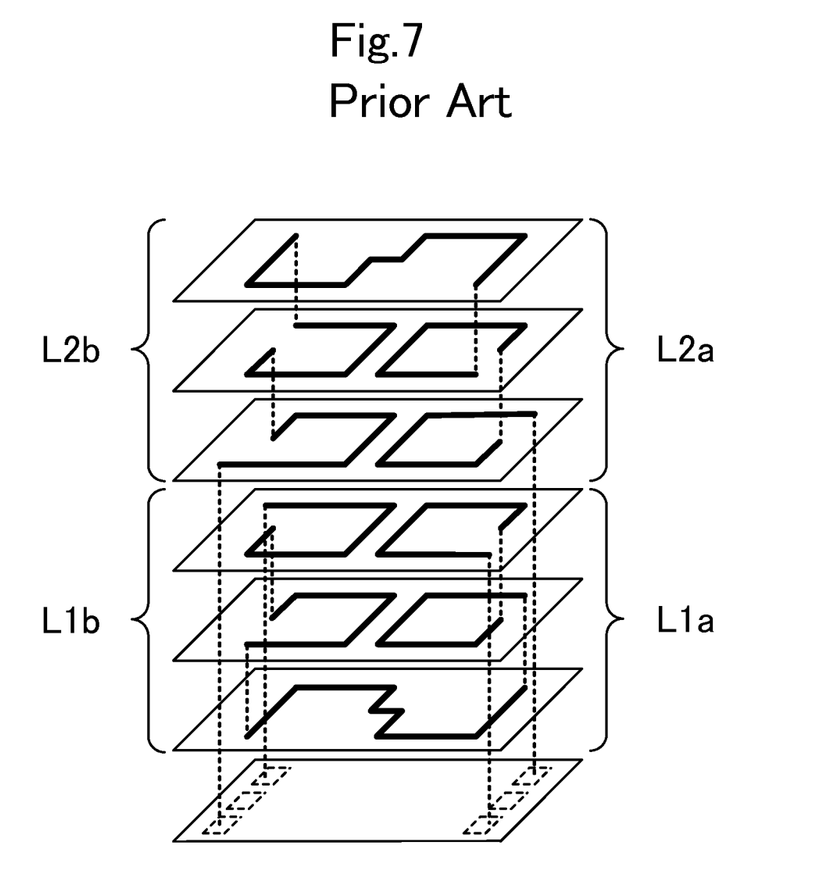
FIG. 7 is a diagram illustrating an example of conductor patterns at respective layers in a case where the impedance conversion circuit illustrated in FIG. 6 is configured as a multilayer substrate.

For example, Japanese Patent No. 4935956 discloses such an antenna device compatible with a wide frequency band. FIG. 6 is one example of a circuit diagram of the antenna device disclosed in the Japanese Patent No. 4935956. An impedance conversion circuit 25 of this antenna device includes a primary coil composed of a coil element L1a and a coil element L1b and a secondary coil composed of a coil element L2a and a coil element L2b. A first end portion of the coil element L1a is connected to a feeding circuit 30, a second end portion of the coil element L1b is connected to an antenna element 11, a first end portion of the coil element L2b is connected to the antenna element 11, and a second end portion of the coil element L2a is connected to ground. FIG. 7 is a diagram illustrating an example of conductor patterns at respective layers in a case where the impedance conversion circuit illustrated in FIG. 6 is formed as a multilayer substrate. Conductor patterns that form the coil element L1a, the coil element L1b, the coil element L2a, and the coil element L2b are formed at a plurality of dielectric layers, and those conductor patterns are connected across the layers with a number of via conductors. Further, the coil element L1a is connected in series to the coil element L1b, and similarly the coil element L2a is connected in series to the coil element L2b.

In the antenna devices including impedance conversion circuits, downsizing of the impedance conversion circuit itself is desirable since electronic devices such as cellular phones and the like, in which the antenna devices are incorporated, are being downsized, and the available space for the antenna device is limited. However, as illustrated in FIG. 7, the impedance conversion circuit, in which the conductor patterns are formed in such a way that the coil elements are sequentially connected in series across a plurality of layers, has a larger thickness in a stacking direction of the dielectric layers.

To downsize the impedance conversion circuit itself, it is preferable that the smallest possible number of turns is used in the coils, and the smallest possible number of layers is used in the dielectric layers. However, the impedance conversion ratio of the impedance conversion circuit is determined basically by the number of turns in the primary coil and the secondary coil. Thus, in the case where the number of turns is smaller, it may be difficult to obtain a desired transformer ratio. Further, as the number of turns is reduced, the percentages of inductance at input and output portions, which does not contribute to the coupling of transformer, become larger. This creates another issue in obtaining a coupling factor between the primary coil and the secondary coil.

To obtain a predetermined (larger) coupling factor with even smaller coils, it is desirable to use an identical shape (nearly congruent shape) for the primary coil and the secondary coil and arrange them to overlap on top of each other. In the case where the identical shape is used for the primary coil and the secondary coil, however, it may be very difficult to obtain desired inductance values for the primary coil and the secondary coil.

SUMMARY OF THE INVENTION

Therefore, preferred embodiments of the present disclosure provide an impedance conversion circuit that achieves a larger coupling factor with even smaller coils and a desired impedance conversion ratio, and provide an antenna device including the impedance conversion circuit.

An impedance conversion circuit according to a preferred embodiment of the present invention includes a primary coil L1 and a secondary coil L2 that are electromagnetically coupled to each other, wherein the primary coil L1 includes a first coil element L1a and a second coil element L1b that are connected in parallel, the first coil element L1a and the second coil element L1b being circularly arranged on a single plane so as to allow currents flowing through the first coil element L1a and the second coil element L1b to flow in directions opposite to each other; the secondary coil L2 includes a third coil element L2a and a fourth coil element L2b that are connected in series, the third coil element L2a and the fourth coil element L2b being arranged in a figure-of-eight pattern on a single plane so as to allow currents flowing through the third coil element L2a and the fourth coil element L2b to flow in directions opposite to each other; the first coil element L1a and the third coil element L2a are arranged coaxially adjacent to each other, the first coil element L1a is mainly magnetically coupled with the third coil element L2a; and the second coil element L1b and the fourth coil element L2b are arranged coaxially adjacent to each other, the second coil element L1b is mainly magnetically coupled with the fourth coil element L2b.

The foregoing configuration provides an impedance conversion circuit that has a large transformer ratio of the primary coil and the secondary coil even with a smaller number of turns and a smaller number of layers.

Further, the foregoing configuration improves the coupling factor of the primary coil L1 and the secondary coil L2.

Preferably, conductor patterns defining the third coil element L2a and the fourth coil element L2b have line widths wider than conductor patterns defining the first coil element L1a and the second coil element L1b. This configuration achieves a stable coupling factor even if there is a misalignment between the conductor patterns of the third coil element L2a and the fourth coil element L2b and the conductor patterns of the first coil element L1a and the second coil element L1b.

Preferably, the first coil element L1a overlaps the third coil element L2a in a planar view, and the second coil element L1b overlaps the fourth coil element L2b in planar view. This configuration allows the coil elements arranged adjacent to each other in a layering direction to couple more strongly, and achieves a higher coupling factor.

Preferably, coil openings of the first coil element L1a and the third coil element L2a are smaller than coil openings of the second coil element L1b and the fourth coil element L2b. This configuration allows the ratio between the inductance of the primary coil and the inductance of the secondary coil to be even larger without decreasing the coupling factor of the primary coil and the secondary coil.

An antenna device according to a preferred embodiment of the present invention includes the impedance conversion circuit having the foregoing configuration and an antenna element including an input portion to which the impedance conversion circuit is connected. This configuration provides an antenna device that matches the impedance of a feeding circuit despite of having the antenna element that generally has a lower impedance.

Preferably, the primary coil L1 is connected to a feeding circuit at one end portion and connected to the antenna element at the other end portion, and the secondary coil L2 is connected to ground at one end portion and connected to the antenna element at the other end portion. This configuration allows a negative inductance due to the mutual inductance between the primary coil and the secondary coil to operate in such a manner that the negative inductance cancels out an inductance component of the antenna so as to achieve wide band antenna characteristics.

According to various preferred embodiments of the present invention, there are provided an impedance conversion circuit and an antenna device including the impedance conversion circuit, which has a predetermined coupling factor and a predetermined transformer ratio even with smaller coils having a smaller number of turns and a smaller number of layers.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
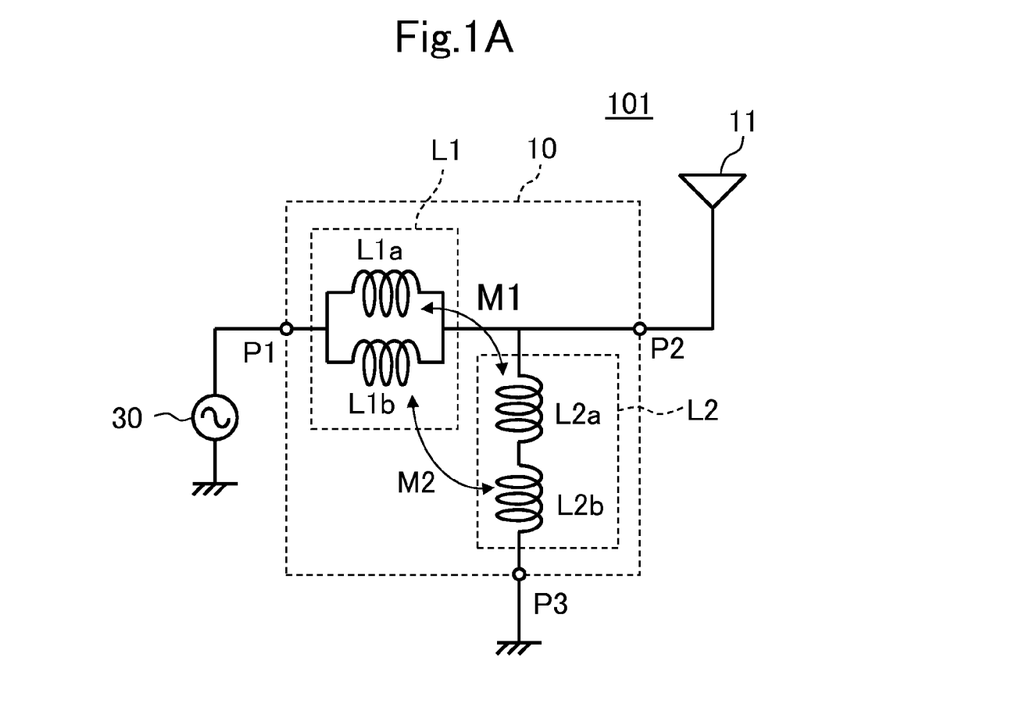
FIG. 1A is a circuit diagram of an antenna device including an impedance conversion circuit according to a first preferred embodiment of the present invention.
Figure 1B:
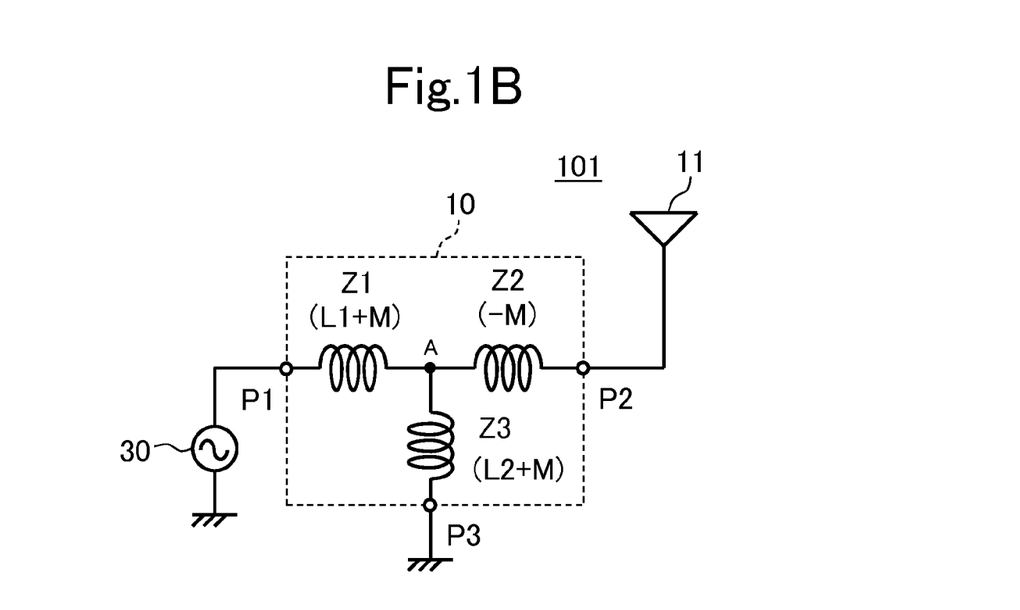
FIG. 1B is an equivalent circuit diagram thereof.

FIG. 1A is a circuit diagram of an antenna device 101 including an impedance conversion circuit 10 according to a first preferred embodiment of the present invention, and FIG. 1B is an equivalent circuit diagram thereof.

As illustrated in FIG. 1A, the antenna device 101 includes an antenna element 11 and the impedance conversion circuit 10 connected to the antenna element 11. A feeding end portion of the antenna element 11 is connected to the impedance conversion circuit 10. In the impedance conversion circuit 10, a primary coil L1 is provided between the antenna element 11 and a feeding circuit 30. The feeding circuit 30 is a feeding circuit configured to supply a high frequency signal to the antenna element 11, and generate and process the high frequency signal. The feeding circuit 30 may additionally include circuitry configured to multiplex or demultiplex the high frequency signal.

The impedance conversion circuit 10 includes the primary coil L1 connected to the feeding circuit 30 and a secondary coil L2 coupled to the primary coil L1. Specifically, a first end portion of the primary coil L1 is connected to the feeding circuit 30, and a second end portion thereof is connected to the antenna element 11. A first end portion of the secondary coil L2 is connected to the antenna element 11, and a second end portion thereof is connected to ground.

The impedance conversion circuit 10 includes a transformer circuit in which the primary coil L1 and the secondary coil L2 are coupled to each other via mutual inductance M1 and mutual inductance M2. As illustrated in FIG. 1B, the transformer circuit may be equivalently transformed to a T-shape circuit including three inductance elements Z1, Z2, and Z3. In other words, this T-shape circuit includes a first port P1 to be connected to the feeding circuit 30, a second port P2 to be connected to the antenna element 11, a third port P3 to be connected to ground, the inductance element Z1 connected between the first port P1 and a fork A, the inductance element Z2 connected between the second port P2 and the fork A, and the inductance element Z3 connected between the third port P3 and the fork A.

When the inductance of the primary coil L1 illustrated in FIG. 1A is expressed as L1, the inductance of the secondary coil L2 illustrated in FIG. 1A is expressed as L2, and the mutual inductance is expressed as M, the inductance of the inductance element Z1 illustrated in FIG. 1B is L1+M, the inductance of the inductance element Z2 illustrated in FIG. 1B is −M, and the inductance of the inductance element Z3 illustrated in FIG. 1B is L2+M.

In the T-shape circuit illustrated in FIG. 1B, a portion (Z1 and Z3) between the port P1, which is to be connected to the feeding circuit 30, and the port P3, which is to be connected to ground, is configured to contribute to the impedance conversion due to the transformer ratio. In other words, the impedance conversion ratio of the impedance conversion circuit 10 is (L1+L2+2M):L2.

Figure 2:
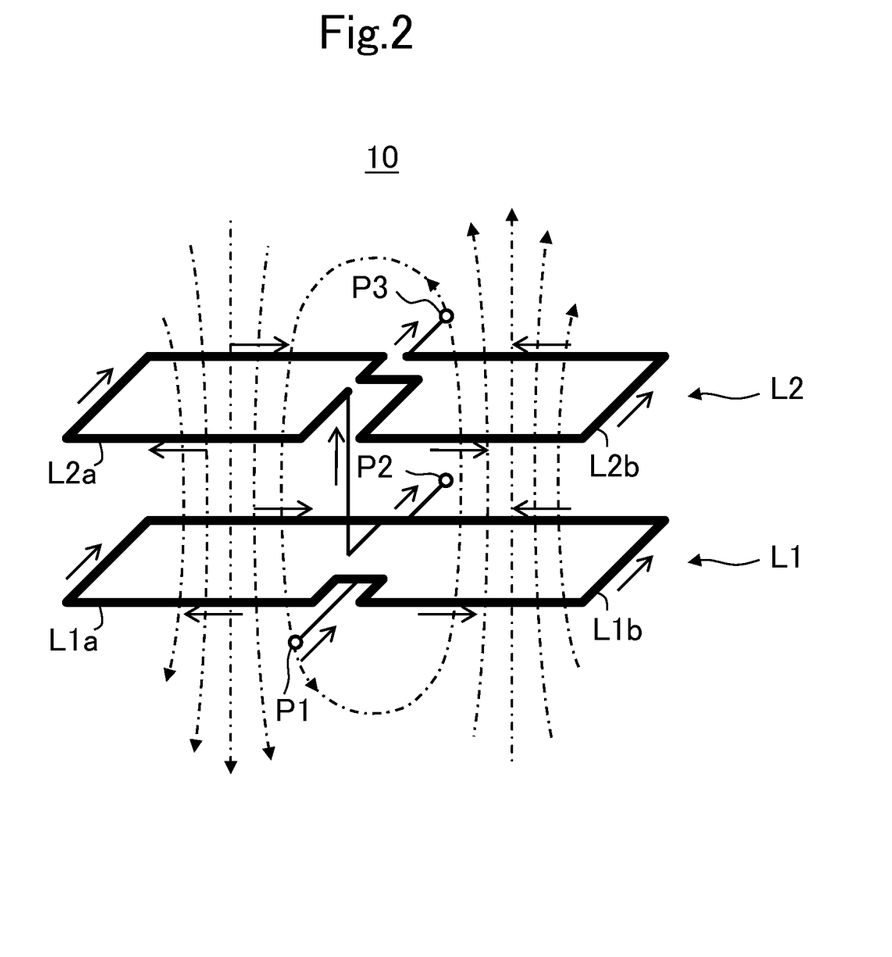
FIG. 2 is a perspective view of various conductor patterns of the impedance conversion circuit according to the first preferred embodiment of the present invention.
Figure 3:
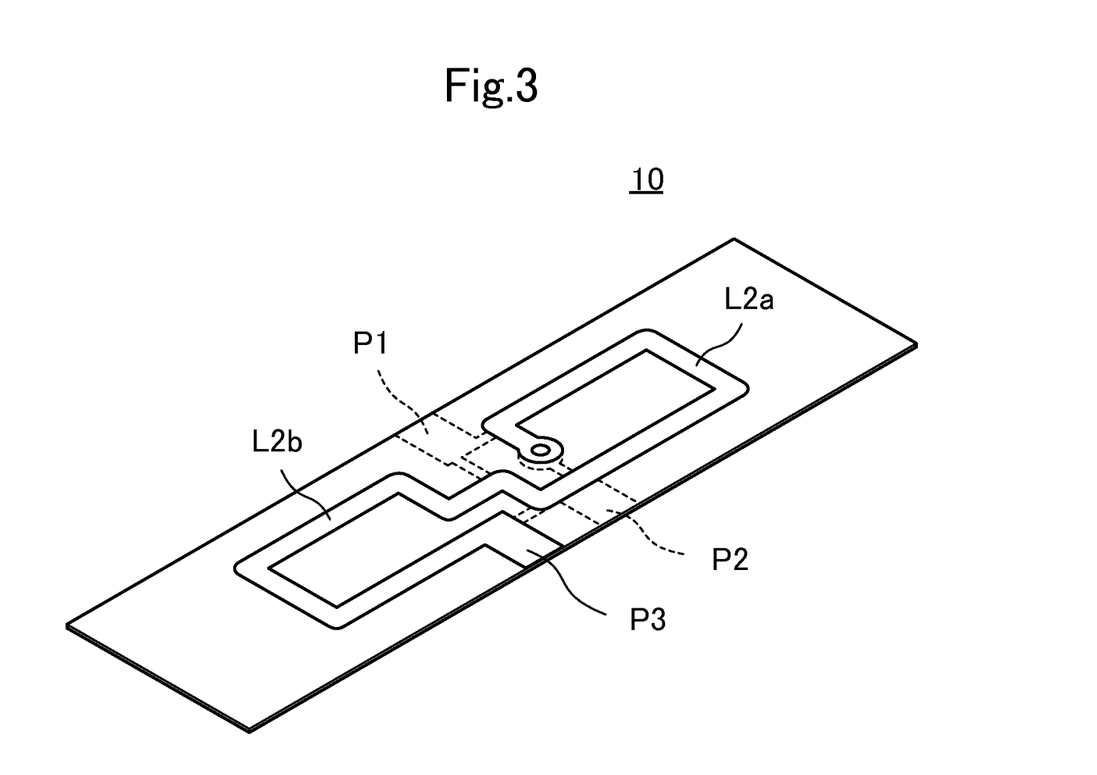
FIG. 3 is a perspective view of the impedance conversion circuit.

FIG. 2 is a perspective view of various conductor patterns of the impedance conversion circuit 10 according to the first preferred embodiment. In the figure, dielectric layers on which those conductor patterns are provided are omitted. Further, FIG. 3 is a perspective view of the impedance conversion circuit 10. Still further, FIG. 4 is a diagram illustrating the conductor patterns provided at respective dielectric layers of the impedance conversion circuit 10.

Figure 4:
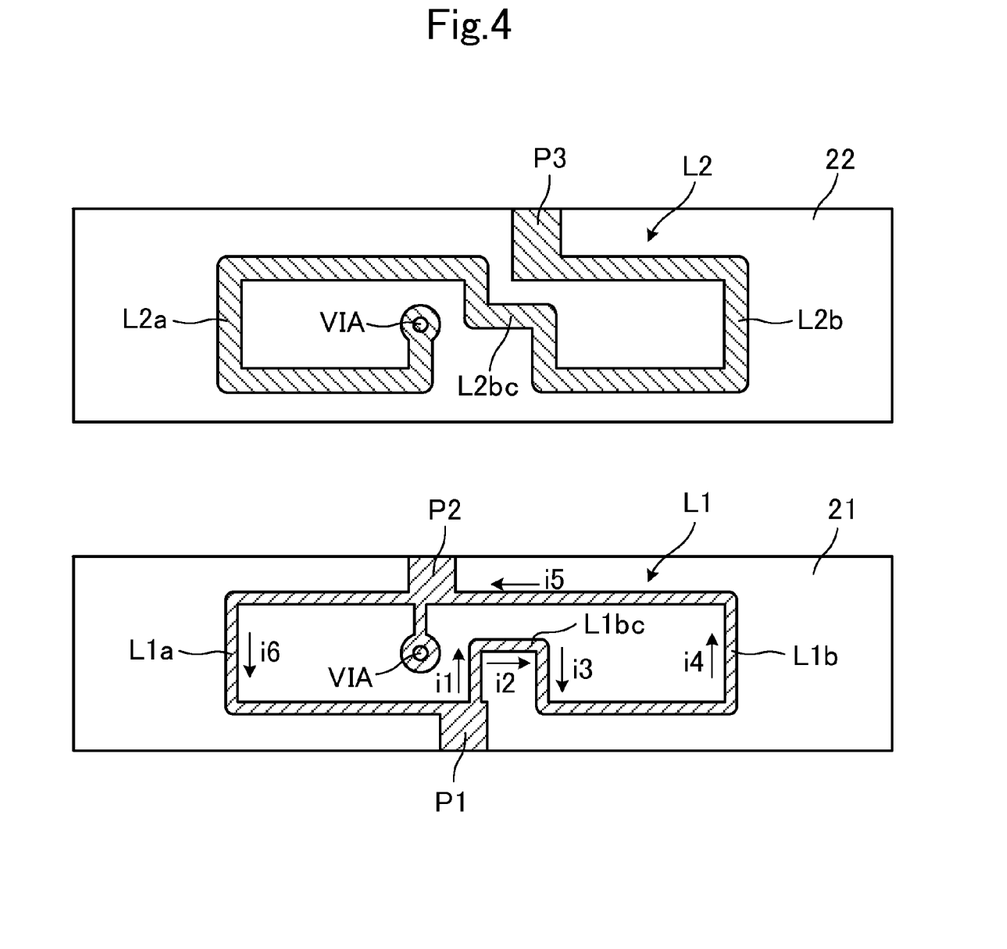
FIG. 4 is a diagram illustrating conductor patterns formed at respective dielectric layers of the impedance conversion circuit.

As illustrated in FIG. 4, a first coil element L1a and a second coil element L1b are provided on a dielectric layer 21. The second coil element L1b includes a bended portion L1bc as a portion thereof (a function of the bended portion L1bc will be described below). A first end portion of the first coil element L1a is connected to the first port (feeding port) P1, and a second end portion of the first coil element L1a is connected to the second port (antenna port) P2. A first end portion of the second coil element L1b is connected to the first port (feeding port) P1, and a second end portion of the second coil element L1b is connected to the second port (antenna port) P2. In other words, the first coil element L1a is connected in parallel to the second coil element L1b, and both coil elements are connected between the first port P1 and the second port P2. The first coil element L1a and the second coil element L1b define the primary coil.

A third coil element L2a and a fourth coil element L2b are provided on a dielectric layer 22. The fourth coil element L2b includes a bended portion L2bc as a portion thereof (a function of the bended portion L2bc will be described below). A first end portion of the third coil element L2a is connected to the second port (antenna port) P2 via a via-conductor VIA. A first end portion of the fourth coil element L2b is connected to the third port (ground port) P3. A second end portion of the third coil element L2a is connected to a second end portion of the fourth coil element L2b. In other words, the third coil element L2a is connected in series to the fourth coil element L2b, and both coil elements are connected between the second port P2 and the third port P3. The third coil element L2a and the fourth coil element L2b define the secondary coil.

As illustrated in FIG. 2 to FIG. 4, the first coil element L1a and the third coil element L2a are arranged coaxially adjacent to each other, and the second coil element L1b and the fourth coil element L2b are arranged coaxially adjacent to each other. Further, the first coil element L1a is mainly magnetically coupled with the third coil element L2a, and the second coil element L1b is mainly magnetically coupled with the fourth coil element L2b. Dashed-dotted lines in FIG. 2 represent how the magnetic flux flows through openings of respective coil elements.

As described above, the first coil element L1a and the third coil element L2a are arranged coaxially adjacent to each other, and the second coil element L1b and the fourth coil element L2b are arranged coaxially adjacent to each other. Thus, the first coil element L1a and the third coil element L2a are in close proximity in a layering direction, and the second coil element L1b and the fourth coil element L2b are in close proximity in the layering direction. Accordingly, a larger coupling factor is obtained despite of a smaller number of coil turns.

Further, the first coil element L1a and the second coil element L1b are arranged on the same plane, and the third coil element L2a and the fourth coil element L2b are arranged on the same plane. Thus, the impedance conversion circuit includes a lower number of layers, and the thickness dimension in the stacking direction may be reduced.

When the inductances of the first coil element L1a, the second coil element L1b, the third coil element L2a, and the fourth coil element L2b are expressed as L1a, L1b, L2a, and L2b, the inductance of the primary coil L1 is expressed as L1, and the inductance of the secondary coil is expressed as L2, the following equations are satisfied:

$$L1=(L1a*L1b)/(L1a+L1b)$$

$$L2=L2a+L2b$$

Suppose that the inductances L1a, L1b, L2a, and L2b are all the same value, and that value is expressed as Lu, then the following relationships are satisfied:

$$L1=Lu/2$$

$$L2=2Lu$$

Thus, the ratio of inductance values of the primary coil L1 and the secondary coil L2 becomes as follows:

$$L1:L2=1:4$$

As illustrated in FIG. 4, the second coil element L1b includes, as a portion thereof, the bended portion L1bc that bends toward the inside of a coil element formation region. The fourth coil element L2b includes, as a portion thereof, the bended portion L2bc that faces the bended portion L1bc in the layering direction. This is adopted to facilitate passing of magnetic flux in each loop of the coil elements as illustrated in FIG. 2. In other words, if the first coil element L1a and the second coil element L1b were configured in a simple rectangle loop without the bended portion L1bc, the loop functions as a metal plate equivalent. This makes the passing of magnetic flux somewhat difficult. In the case where the bended portion L1bc is provided, currents (i1, i6), (i2, i5), and (i3, i4), which are denoted by arrows, flow in opposite directions to each other in each current pair when the currents i1 to i6 are flowing in the first coil element L1a and the second coil element L1b. This facilitates the passing of magnetic flux through loops of the first coil element L1a and the second coil element L1b.

Further, as illustrated in FIG. 4, the conductor patterns defining the third coil element L2a and the fourth coil element L2b have line widths wider than the conductor patterns forming the first coil element L1a and the second coil element L1b. Therefore, when dielectric sheets on which conductor patterns are provided are being stacked, nearly no effect is produced even if there is a misalignment of the conductor patterns due to the influence of printing position accuracy of the conductor patterns or stacking position accuracy of the dielectric sheets. In other words, in planar view of these conductor patterns, the third coil element L2a and the fourth coil element L2b overlap and cover the whole of the first coil element L1a and the second coil element L1b. Thus, a stable coupling factor may be obtained.

Further, as illustrated in FIG. 4, the conductor patterns of the third coil element L2a and the fourth coil element L2b that are connected in series are made thicker than the conductor patterns of the first coil element L1a and the second coil element L1b that are connected in parallel. This reduces the total conductor loss of the impedance conversion circuit and improves the Q value. In other words, compared to the case where the conductor patterns of the first coil element L1a and the second coil element L1b that are connected in parallel are made thicker, the reduction effect of the conductor loss increases in the case where the conductor patterns of the third coil element L2a and the fourth coil element L2b that are connected in series are made thicker.

Second Preferred Embodiment

Figure 5:
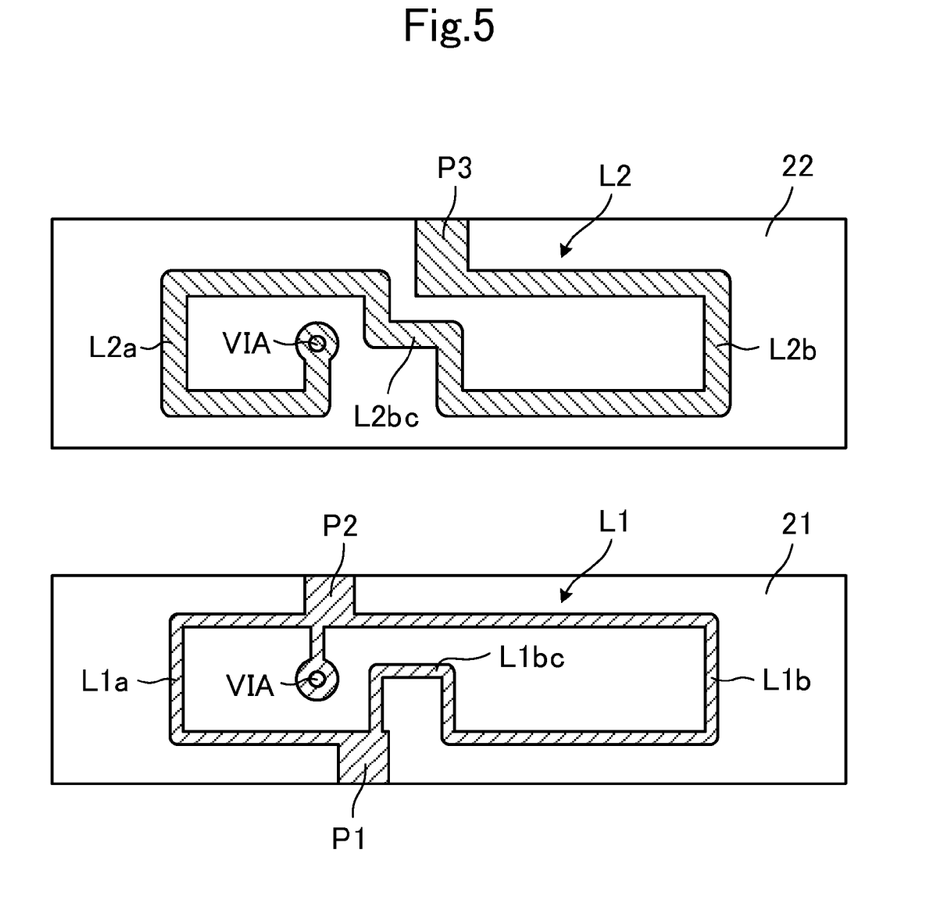
FIG. 5 is a diagram illustrating conductor patterns formed at respective dielectric layers of an impedance conversion circuit according to a second preferred embodiment of the present invention.

FIG. 5 is a diagram illustrating conductor patterns provided at respective dielectric layers of an impedance conversion circuit according to a second preferred embodiment of the present invention.

In FIG. 5, a first coil element L1a and a second coil element L1b, which are provided on a dielectric layer 21, define a primary coil L1. Further, a third coil element L2a and a fourth coil element L2b, which are provided on a dielectric layer 22, define a secondary coil L2. Basic patterns of the first coil element L1a, the second coil element L1b, the third coil element L2a, and the fourth coil element L2b are the same as those illustrated in FIG. 4. In the example illustrated in FIG. 5, the inductance of the first coil element L1a is different from that of the second coil element L1b, the inductance of the first coil element L1a is the same or substantially the same as that of the third coil element L2a, and the inductance of the second coil element L1b is the same or substantially the same as that of the fourth coil element L2b. In the example of FIG. 5, the path length of the first coil element L1a is preferably relatively shorter than that of the second coil element L1b, and correspondingly the path length of the third coil element L2a is preferably relatively shorter than that of the fourth coil element L2b. When the inductances of the first coil element L1a, the second coil element L1b, the third coil element L2a, and the fourth coil element L2b are expressed as L1a, L1b, L2a, and L2b, the following relationships are satisfied:

$$L1a \neq L1b$$

$$L2a \neq L2b$$

$$L1a = L2a$$

$$L1b = L2b$$

This configuration further increases the ratio between the inductance of the primary coil L1, ((L1a*L1b)/(L1a+L1b)), and the inductance of the secondary coil L2, (L2a+L2b), without reducing the coupling factor of the primary coil L1 and the secondary coil L2. In other words, the inductance of the primary coil L1 decreases as the inductance L1a decreases. Here, of the first coil element L1a and the second coil element L1b that are connected in parallel, the inductance L1a is the inductance of one that has the smaller inductance. On the other hand, the inductance of the secondary coil L2 may be kept constant since the inductance of the secondary coil L2 is the sum of the inductances of the third coil element L2a and the fourth coil element L2b that are connected in series. Accordingly, the ratio between the primary coil L1 and the secondary coil L2 is easily made larger.

With regard to materials of substrates forming the impedance conversion circuits according to the preferred embodiments of the present invention, rigid substrates such as glass epoxy substrates, polytetrafluoroethylene (PTFE) substrates, and the like may be used, or flexible substrates such as polyethylene terephthalate (PET) films, polyimide (PI), liquid crystal polymer (LCP), and the like may be alternatively used. The flexible substrate is thin and flexible, provides higher flexibility when installing inside devices, and is suitable for use in small electronic devices and the like. Particularly, the liquid crystal polymer is a suitable substrate material for high frequency circuits since the liquid crystal polymer has a smaller loss (smaller passing loss) and a smaller relative permittivity (higher self-resonant frequency) compared to other flexible substrate materials.

In the foregoing examples, one end portion of the primary coil L1 is connected to the feeding circuit, the other end portion of the primary coil L1 is connected to the antenna element, one end portion of the secondary coil L2 is connected to ground, and the other end portion of the secondary coil L2 is connected to the antenna element. However, the preferred embodiments of the present invention are not limited thereto. Alternatively, for example, the impedance conversion circuit may be provided between the feeding circuit and the antenna element by connecting one end portion of the primary coil L1 to the feeding circuit, connecting the other end portion of the primary coil L1 to ground, connecting one end portion of the secondary coil L2 to the antenna element, and connecting the other end portion of the secondary coil L2 to ground.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance conversion circuit comprising:
   a primary coil and a secondary coil electromagnetically coupled to each other; wherein
   the primary coil includes a first coil element and a second coil element that are connected in parallel, the first coil element and the second coil element together define a closed parallel circuit arranged on a single plane to cause currents flowing through the first coil element and the second coil element to flow in directions opposite to each other;
   the secondary coil includes a third coil element and a fourth coil element that are connected in series, the third coil element and the fourth coil element being arranged in a figure-of-eight pattern on a single plane to cause currents flowing through the third coil element and the fourth coil element to flow in directions opposite to each other;
   the first coil element and the third coil element are arranged coaxially adjacent to each other such that the first coil element is mainly magnetically coupled with the third coil element; and
   the second coil element and the fourth coil element are arranged coaxially adjacent to each other such that the second coil element is mainly magnetically coupled with the fourth coil element.

2. The impedance conversion circuit according to claim 1, wherein conductor patterns defining the third coil element and the fourth coil element have line widths wider than conductor patterns defining the first coil element and the second coil element.

3. The impedance conversion circuit according to claim 1, wherein the first coil element overlaps the third coil element in a planar view, and the second coil element overlaps the fourth coil element in a planar view.

4. The impedance conversion circuit according to claim 1, wherein coil openings of the first coil element and the third coil element are smaller than coil openings of the second coil element and the fourth coil element.

5. The impedance conversion circuit according to claim 1, wherein a ratio of an inductance value of the primary coil to an inductance value of the secondary coil is 1:4.

6. The impedance conversion circuit according to claim 1, wherein conductor patterns defining the third coil element and the fourth coil element are thicker than conductor patterns defining the first coil element and the second coil element.

7. The impedance conversion circuit according to claim 1, wherein an inductance of the first coil element is different from an inductance of the second coil element, the inductance of the first coil element is equal to an inductance of the third coil element, and the inductance of the second coil element is equal to an inductance of the fourth coil element.

8. An antenna device comprising:
   an impedance conversion circuit; and
   an antenna element including an input portion to which the impedance conversion circuit is connected; wherein
   the impedance conversion circuit includes a primary coil and a secondary coil electromagnetically coupled to each other;
   the primary coil includes a first coil element and a second coil element that are connected in parallel, the first coil element and the second coil element together define a closed parallel circuit arranged on a single plane to cause currents flowing through the first coil element and the second coil element to flow in directions opposite to each other;

the secondary coil includes a third coil element and a fourth coil element that are connected in series, the third coil element and the fourth coil element being arranged in a figure-of-eight pattern on a single plane to cause currents flowing through the third coil element and the fourth coil element to flow in directions opposite to each other;

the first coil element and the third coil element are arranged coaxially adjacent to each other such that the first coil element is mainly magnetically coupled with the third coil element; and the second coil element and the fourth coil element are arranged coaxially adjacent to each other such that the second coil element is mainly magnetically coupled with the fourth coil element.

9. The antenna device according to claim 8, wherein the primary coil is connected to a feeding circuit at a first end portion and connected to the antenna element at a second end portion, and the secondary coil is connected to ground at a first end portion and connected to the antenna element at a second end portion.

10. The antenna device according to claim 8, wherein the impedance conversion circuit is provided between a feeding circuit and the antenna element.

11. The antenna device according to claim 10, wherein a first end portion of the primary coil is connected to the feeding circuit, a second end portion of the primary coil is connected to ground, a first end portion of the secondary coil is connected to the antenna element, and a second end portion of the secondary coil to ground.

12. The antenna device according to claim 8, wherein conductor patterns defining the third coil element and the fourth coil element have line widths wider than conductor patterns defining the first coil element and the second coil element.

13. The antenna device according to claim 8, wherein the first coil element overlaps the third coil element in a planar view, and the second coil element overlaps the fourth coil element in a planar view.

14. The antenna device according to claim 8, wherein coil openings of the first coil element and the third coil element are smaller than coil openings of the second coil element and the fourth coil element.

15. The antenna device according to claim 8, wherein a ratio of an inductance value of the primary coil to an inductance value of the secondary coil is 1:4.

16. The antenna device according to claim 8, wherein conductor patterns defining the third coil element and the fourth coil element are thicker than conductor patterns defining the first coil element and the second coil element.

17. The antenna device according to claim 8, wherein an inductance of the first coil element is different from an inductance of the second coil element, the inductance of the first coil element is equal to an inductance of the third coil element, and the inductance of the second coil element is equal to an inductance of the fourth coil element.

18. An impedance conversion circuit comprising:
a primary coil and a secondary coil electromagnetically coupled to each other; wherein
the primary coil includes a first coil element and a second coil element that are connected in parallel, the first coil element and the second coil element being circularly arranged on a single plane to cause currents flowing through the first coil element and the second coil element to flow in directions opposite to each other;
the secondary coil includes a third coil element and a fourth coil element that are connected in series, the third coil element and the fourth coil element being arranged in a figure-of-eight pattern on a single plane to cause currents flowing through the third coil element and the fourth coil element to flow in directions opposite to each other;
the first coil element and the third coil element are arranged coaxially adjacent to each other such that the first coil element is mainly magnetically coupled with the third coil element;
the second coil element and the fourth coil element are arranged coaxially adjacent to each other such that the second coil element is mainly magnetically coupled with the fourth coil element; and
an inductance of the first coil element is different from an inductance of the second coil element, the inductance of the first coil element is equal to an inductance of the third coil element, and the inductance of the second coil element is equal to an inductance of the fourth coil element.

19. An antenna device comprising:
an impedance conversion circuit; and
an antenna element including an input portion to which the impedance conversion circuit is connected; wherein
the impedance conversion circuit includes a primary coil and a secondary coil electromagnetically coupled to each other;
the primary coil includes a first coil element and a second coil element that are connected in parallel, the first coil element and the second coil element being circularly arranged on a single plane to cause currents flowing through the first coil element and the second coil element to flow in directions opposite to each other;
the secondary coil includes a third coil element and a fourth coil element that are connected in series, the third coil element and the fourth coil element being arranged in a figure-of-eight pattern on a single plane to cause currents flowing through the third coil element and the fourth coil element to flow in directions opposite to each other;
the first coil element and the third coil element are arranged coaxially adjacent to each other such that the first coil element is mainly magnetically coupled with the third coil element;
the second coil element and the fourth coil element are arranged coaxially adjacent to each other such that the second coil element is mainly magnetically coupled with the fourth coil element; and
an inductance of the first coil element is different from an inductance of the second coil element, the inductance of the first coil element is equal to an inductance of the third coil element, and the inductance of the second coil element is equal to an inductance of the fourth coil element.

* * * * *